United States Patent
Charipadi et al.

(10) Patent No.: US 8,219,103 B2
(45) Date of Patent: Jul. 10, 2012

(54) COMMUNICATION UNIT AND METHOD FOR FREQUENCY SYNCHRONISING IN A CELLULAR COMMUNICATION NETWORK

(75) Inventors: Gopikrishna Charipadi, Bangalore (IN); James Edward Brereton Harrow, Cambridge (GB)

(73) Assignee: IP.Access Limited, Cambourne, Cambridge (GB)

( * ) Notice: Subject to any disclaimer, the term of this patent is extended or adjusted under 35 U.S.C. 154(b) by 28 days.

(21) Appl. No.: 12/863,846

(22) PCT Filed: Dec. 15, 2008

(86) PCT No.: PCT/EP2008/067514
§ 371 (c)(1),
(2), (4) Date: Dec. 1, 2010

(87) PCT Pub. No.: WO2009/092499
PCT Pub. Date: Jul. 30, 2009

(65) Prior Publication Data
US 2011/0077035 A1 Mar. 31, 2011

(30) Foreign Application Priority Data
Jan. 23, 2008 (GB) .................................. 0801201.5

(51) Int. Cl.
*H04W 40/00* (2009.01)
(52) U.S. Cl. ..... 455/447; 455/448; 455/449; 455/422.1; 455/443; 455/444
(58) Field of Classification Search ............... 455/422.1, 455/426.1, 426.2, 432.2, 432.3, 436, 438, 455/440, 442, 443, 444, 447–454, 464, 509; 370/328–338
See application file for complete search history.

(56) References Cited

U.S. PATENT DOCUMENTS

| 5,517,535 | A | | 5/1996 | Kroeger et al. | |
|---|---|---|---|---|---|
| 6,018,663 | A | * | 1/2000 | Karlsson et al. | 455/450 |
| 6,477,154 | B1 | * | 11/2002 | Cheong et al. | 370/328 |
| 7,974,230 | B1 | * | 7/2011 | Talley et al. | 370/318 |

(Continued)

FOREIGN PATENT DOCUMENTS

EP   0 844 764   5/1998

(Continued)

OTHER PUBLICATIONS

Turner, Clay S., "Recursive Discrete-Time Sinusoidal Oscillators", IEEE Signal Processing Magazine, vol. 20, No. 3, May 1, 2003, pp. 103-111.

*Primary Examiner* — Dominic E Rego
(74) *Attorney, Agent, or Firm* — Fitch Even Tabin & Flannery LLP

(57) ABSTRACT

A communication unit is capable of communicating in a wireless communication network. The communication unit comprises a receiver for receiving timing signals from a plurality of serving wireless communication units; a frequency synchronizing circuit operably coupled to the receiver for synchronizing an operating frequency of the communication unit to a serving wireless communication unit of the plurality of serving wireless communication units Control logic is capable of controlling the frequency synchronizing circuit to adjust an operating frequency of the communication unit. The control logic is arranged to distinguish between macro cell transmissions and femto cell transmissions and in response thereto selectively use or reject timing signals from the plurality of serving wireless communication units in adjusting the operating frequency of the wireless communication unit.

15 Claims, 5 Drawing Sheets

U.S. PATENT DOCUMENTS

| | | | |
|---|---|---|---|
| 2005/0096034 A1* | 5/2005 | Petermann | 455/422.1 |
| 2009/0097452 A1* | 4/2009 | Gogic | 370/331 |
| 2009/0135761 A1* | 5/2009 | Khandekar et al. | 370/328 |
| 2009/0156213 A1* | 6/2009 | Spinelli et al. | 455/436 |
| 2009/0325625 A1* | 12/2009 | Hugl et al. | 455/522 |
| 2010/0015981 A1* | 1/2010 | Shimazaki et al. | 455/436 |
| 2010/0113029 A1* | 5/2010 | Bjorken | 455/437 |
| 2011/0310803 A1* | 12/2011 | Schladetzky et al. | 370/328 |

FOREIGN PATENT DOCUMENTS

| | | |
|---|---|---|
| EP | 1 530 334 | 5/2005 |
| WO | 2007/129258 | 11/2007 |

\* cited by examiner

FIG. 1 - PRIOR ART

COMMUNICATION UNIT AND METHOD FOR FREQUENCY SYNCHRONISING IN A CELLULAR COMMUNICATION NETWORK

CROSS REFERENCE TO RELATED APPLICATIONS

This application is a national phase application of International Application No. PCT/EP2008/067514, filed Dec. 15, 2008, claiming priority to Great Britain Application No. 0801201.5, filed Jan. 23, 2008, both of which are incorporated by reference herein in their entirety.

FIELD OF THE INVENTION

The field of the invention relates to a wireless communication unit and method for synchronising therein. In particular, the field of the invention relates to a 3GPP wireless communication unit synchronising to macro-cells in a combined macro cell/femto cell cellular communication system.

BACKGROUND OF THE INVENTION

Wireless communication systems, such as the $2^{nd}$ Generation (2G) (otherwise referred to as Global System for Mobile (GSM) communications and the $3^{rd}$ Generation (3G) of mobile telephone standards and technology, are well known. An example of such 3G standards and technology is the Universal Mobile Telecommunications System (UMTS), developed by the $3^{rd}$ Generation Partnership Project (3GPP) (www.3gpp.org).

Typically, wireless communication units, or User Equipment (UE) as they are often referred to in 3G parlance, communicate with a Core Network (CN) of the 3G wireless communication system via a Radio Network Subsystem (RNS). A wireless communication system typically comprises a plurality of radio network subsystems, each radio network subsystem comprising one or more communication cells to which UEs may attach, and thereby connect to the network.

The $3^{rd}$ generation of wireless communications has been developed for macro-cell mobile phone communications. Such macro cells utilise high power base stations (NodeBs in 3GPP parlance) to communicate with UEs operating within a relatively large coverage area.

Lower power (and therefore smaller coverage area) femto-cells or pico-cells are a recent development within the field of wireless cellular communication systems. Femto-cells or pico-cells (with the term femto-cell being used hereafter to encompass pico-cell or similar) are classified under local area base stations in the 3GPP standard specifications. Femto cells are effectively communication coverage areas supported by low power base stations (otherwise referred to as Access Points (APs)). These cells are able to be piggy-backed onto the more widely used macro-cellular network and support communications to UEs in a restricted, for example 'in-building', environment. Typical applications for such femto-cell APs include, by way of example, residential and commercial (e.g. office) locations, 'hotspots', etc, whereby an AP can be connected to a core network via, for example, the Internet using a broadband connection or the like. In this manner, femto-cells can be provided in a simple, scalable deployment in specific in-building locations, since the quality of services (voice/data) no longer suffers due to massive attenuation of macro cell transmissions going through concrete walls or metallised glass planes in order to reach the user in-building.

In a femto cell network it is known that there may be a very large number of femto cells compared to the number of macro cells, with femto cells often residing within or overlapping macro cells in the same geographic area.

Often, a Voltage Controlled Temperature Compensated (VCTCXO) crystal Oscillator is used to generate a desired (reference) operating frequency for wireless communication units. Such crystal oscillators have been employed in UE receivers operating in macro cells, and are also proposed to be used in femto cells. Although VCTCXOs are inexpensive, and therefore an attractive frequency reference component for wireless communication unit designers, they are known to suffer from a frequency drift from their quiescent operating frequency, which is dependent upon the age of, and any temperature variations affecting, the VCTCXO.

Local oscillator (LO) frequencies for the radio receiver, transmitter and the sampling clocks for baseband data converters (for example analog-to-digital converters and digital-to-analog converters), are derived from the frequency reference generated by the crystal oscillator. Hence, this frequency drift in the crystal oscillator needs to be carefully controlled; otherwise reference frequency drift will lead to degradation of performance in many aspects of the receiver. Worse still, reference frequency drift may eventually render the receiver incapable of decoding received signals due to frequency drifting outside a receiver 'lock' range. Moreover, from a transmission point of view, it is illegal to transmit 3G signals at a frequency error greater than +/−0.1 PPM, as per the 3GPP transmitter specifications for local area base stations (femto cells).

In macro cell communications, base stations, often referred to as NodeBs, are guaranteed to have high frequency stability, as they employ stable, hence expensive, crystal oscillators. The maximum frequency drift specification of macro cells, according to $3^{rd}$ Generation Partnership Project (3GPP) specifications, is +/−0.05 PPM. Notably, this high accuracy macro cell reference frequency compares favourably to the lower accuracy performance of femto cell VCTCXO crystal oscillators, which are typically in the region of less than +/−10 PPM.

Clearly, it is of paramount importance that a femto cell communication unit receiver is in frequency lock with the most stable, accurate transmitter that it is receiving signals from, in order to correctly decode signals. Furthermore, it is important to achieve this high frequency accuracy before the receiver baseband modem attempts to decode the received channels. A desired frequency accuracy performance before decoding would be to reduce the frequency drift down to +/−0.1 PPM. This process of reducing the frequency drift within the receiver's decoding requirements is termed 'frequency synchronisation'.

Existing state of the art frequency synchronisation procedures directly re-tune the wireless communication unit's hardware VCTCXO crystal to correct an estimated frequency error, iteratively. Furthermore, it is known that such frequency synchronisation procedures frequency lock to every received individual base station (previously every macro cell NodeB), in turn, in order to select the best frequency to synchronise its operating frequency to.

In femto cells, it is proposed that femto cell APs incorporate a DL (Downlink) receiver radio sub-system, in a similar manner to a UE receiver, in order to wirelessly receive transmissions from other wireless serving communication units, such as NodeBs and other femto cell APs. It is also proposed that a femto cell AP is able to receive transmissions from macro cells, in a manner that is termed Network Listen.

However, in a typical femto cell environment, it is likely that, in addition to macro cells, there will be many other femto cells in the residential neighbourhood. Hence, it is highly probable that the femto cell's downlink (DL) receiver could frequency lock with any number of femto cell and macro cell reference frequency signals. It is not desirable that a femto cell Downlink (DL) receiver synchronises to another femto cell AP, since femto cell APs will typically employ inexpensive, but less stable VCTCXO crystals.

In the field of oscillator designs, a recent development has been the software digital oscillator. The software digital oscillator is implemented as a standard Quadrature Coupled Recursive Oscillator, which is further described in 'Recursive Discrete-time Sinusoidal Oscillators—IEEE Signal Processing Magazine, May 2003, pages 103-111'. The oscillator topology suggested in the article is illustrated in FIG. 1, and briefly described herein.

The known software digital oscillator, 100, design of FIG. 1 comprises a sinusoid LO generation path, 105, and a cosinusoid LO generation path, 110. Both paths comprise quadrature (IQ) multiplication logic stages 125, which multiply a $Sin(\phi)$ 115 or $Cos(\phi)$ 120 component with a feedback component of $Sin(\phi+x)$ (Q-component) 160 or $Cos(\phi+x)$ (I-component) 165, from the output of the LO generation path, as illustrated.

The outputs of quadrature multiplication logic stages 125 are respectively input to a summing stage 130, 135 and either summed (Q-component) or subtracted (I-component), before being input to delay logic 140, 145 and input to an automatic gain control (AGC) function 150, 155. The reference article suggests measuring the AGC power and scaling the oscillator output to a reference power using the AGC function 150, 155 every I/Q oscillator output sample, of the recursive digital software oscillator, thereby maintaining unity gain always in every I/Q oscillator output sample in order to sustain the oscillator output amplitude. The outputs from the respective AGC functions 150, 155 provide the Q-component and I-component of the software digital oscillator 100. In addition, the outputs provide a feedback input to the respective quadrature multiplication logic stages 125; thus forming a recursive system.

Although a software-based digital oscillator is attractive in theory, the topology of FIG. 1 cannot always be directly realised in practice, due to the stringent time-constraints in the number of instructions per oscillator output that are available. The number of instructions per oscillator output is dictated by the clock speed and architecture of the associated digital signal processor (DSP), on which the digital oscillator is implemented.

The number of instructions per oscillator output in a 3GPP wide band code division multiple access (WCDMA) receiver is defined by its rake receiver operating requirements. A typical WCDMA receiver employs a rake receiver, which essentially has a set of 'fingers'. Each finger independently demodulates a specific propagation path in the received multi-path signal from a cell. The fingers are finally combined together to provide a composite signal comprising a higher Signal-to-Noise (S/N) ratio than that of each of the individual multi-path components.

Practical rake receivers operate on over-sampled data rates (i.e., the rate at which the input signal is sampled and represented to the input of the finger) where the over-sampling rates range from approximately '2' to '8'. Typical rake receivers operate on 4-times over-sampled data, as a trade-off between over-sampling rate and performance/receiver complexity.

A higher over-sampled input data rate at the rake receiver input implies that a more accurate alignment of the finger's sampling point with the received signal path can be achieved, thus improving the receiver performance. At a WCDMA chip rate of 3.84 MHz, a 4-times over-sampling rate translates to an input over-sampled IQ data rate of 15.36 MSPS (Million Samples Per Second). This, in turn, implies that the oscillator has to be fast enough to generate and output 'I' & 'Q' de-rotation waveforms at 15.36 million samples per second as well. The WCDMA downlink frequency range is 2.110 GHz to 2.170 GHz. Hence, at a maximum downlink carrier frequency of 2.170 GHz, a +/−10 ppm frequency drift (typical in femto cell VCTCXO crystal oscillator) translates to +/−21.70 KHz frequency drift. Thus, the processing rate also needs to be applied over the frequency range of +/−211 Hz to +/−21.70 KHz, as established earlier. (Note that +/−211 Hz comes from +/−0.1 PPM, which is the receiver's performance requirement before decoding channels, as was established earlier.)

This fast rate imposes a restriction on the number of instructions (cycles) available for the digital oscillator per output, which in turn is dictated by the DSP used in the design. Practical DSPs have precluded the use of software digital quadrature recursive oscillator designs of the type illustrated in FIG. 1.

Therefore, in existing state of the art oscillator designs for 3GPP DL receivers (for example, User Equipment (UEs) or femto cell APs), software digital oscillators of the type of FIG. 1 have been unsuitable and unused. Instead, in 3GPP DL receivers, the receiver's hardware crystal is directly pulled to correct the frequency error and synchronise to macro-cells.

Thus, there exists a need for a method and apparatus for frequency synchronisation in a cellular communication unit, particularly one for a 3GPP femto cell using inexpensive VCTCXO crystal oscillator in a 3GPP combined femto cell/macro cell communication network, which aims to address at least some of the shortcomings of past and present techniques and/or mechanisms.

SUMMARY OF THE INVENTION

Accordingly, the invention seeks to mitigate, alleviate or eliminate one or more of the abovementioned disadvantages singly or in any combination.

According to aspects of the invention, there are provided a communication unit capable of communicating in a wireless communication network, a radio network sub-system comprising a communication unit, a semiconductor device comprising a frequency synchronizing circuit, a method for frequency synchronizing a communication unit and a tangible, non-transistory, computer program product, in accordance with the Claims.

These and other aspects, features and advantages of the invention will be apparent from, and elucidated with reference to, the embodiment(s) described hereinafter.

Figure 2:
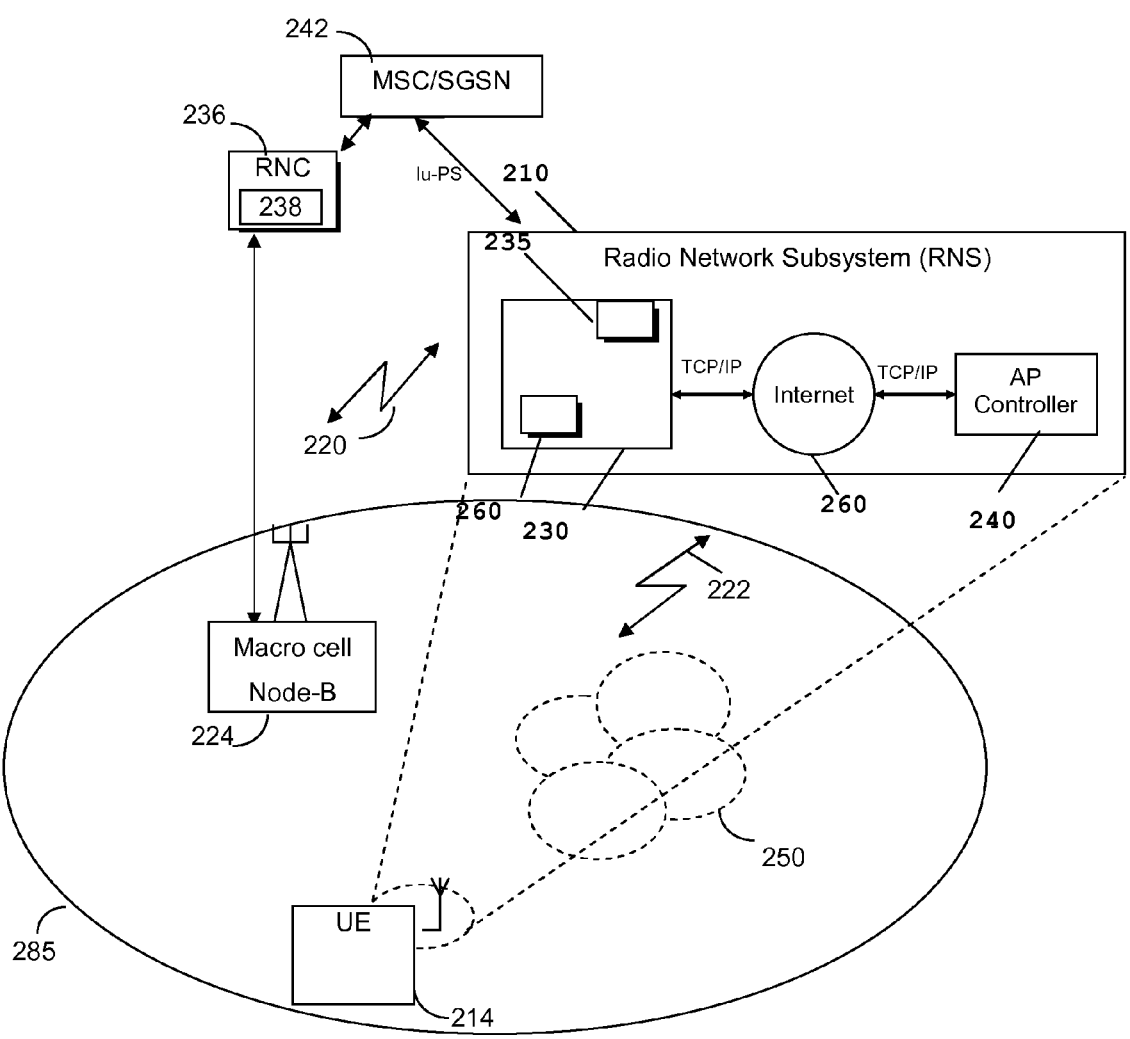

Embodiments of the invention will be described, by way of example only, with reference to the accompanying drawings, in which:

FIG. 2 illustrates an example of a cellular communication system that combines macro-cell and femto-cells, adapted to support frequency synchronisation in accordance with embodiments of the invention.

Figure 3:
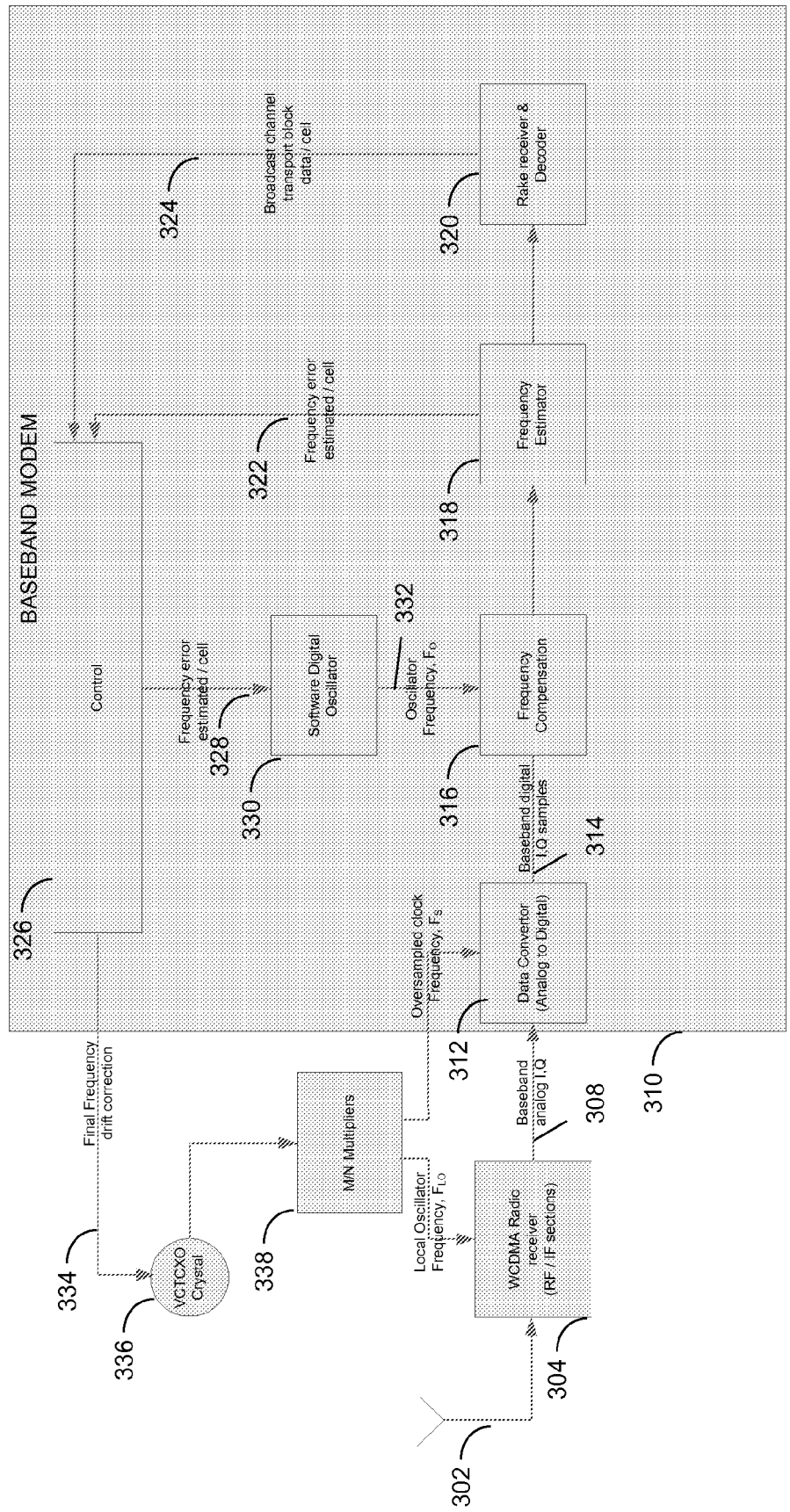

FIG. 3 illustrates a block diagram of a femto cell downlink communication unit and particularly a frequency synchronisation arrangement therein, adapted in accordance with embodiments of the invention.

Figure 4:
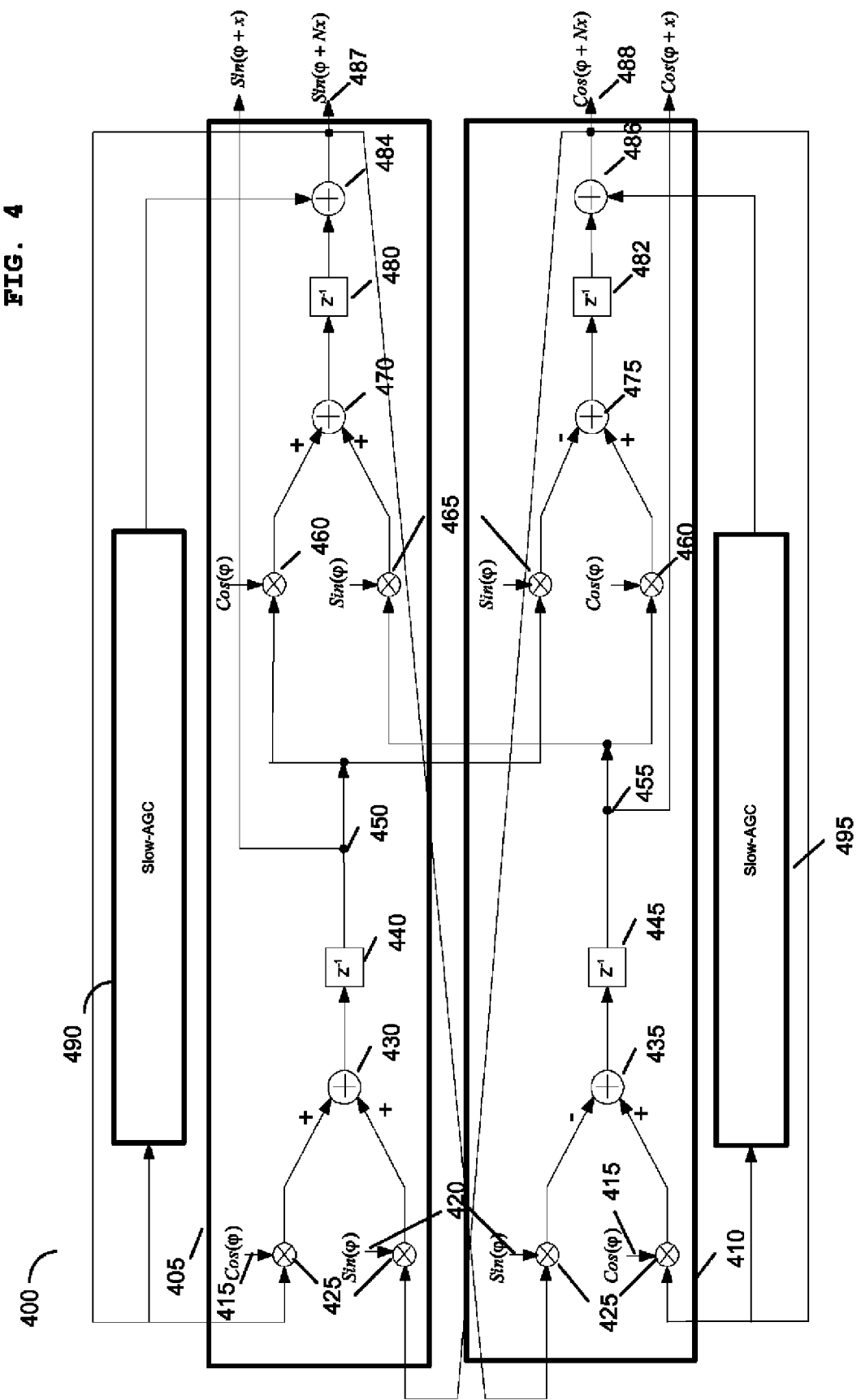

FIG. 4 illustrates a quadrature coupled recursive software digital oscillator architecture comprising parallel Slow-AGC components, in accordance with embodiments of the invention.

Figure 5:
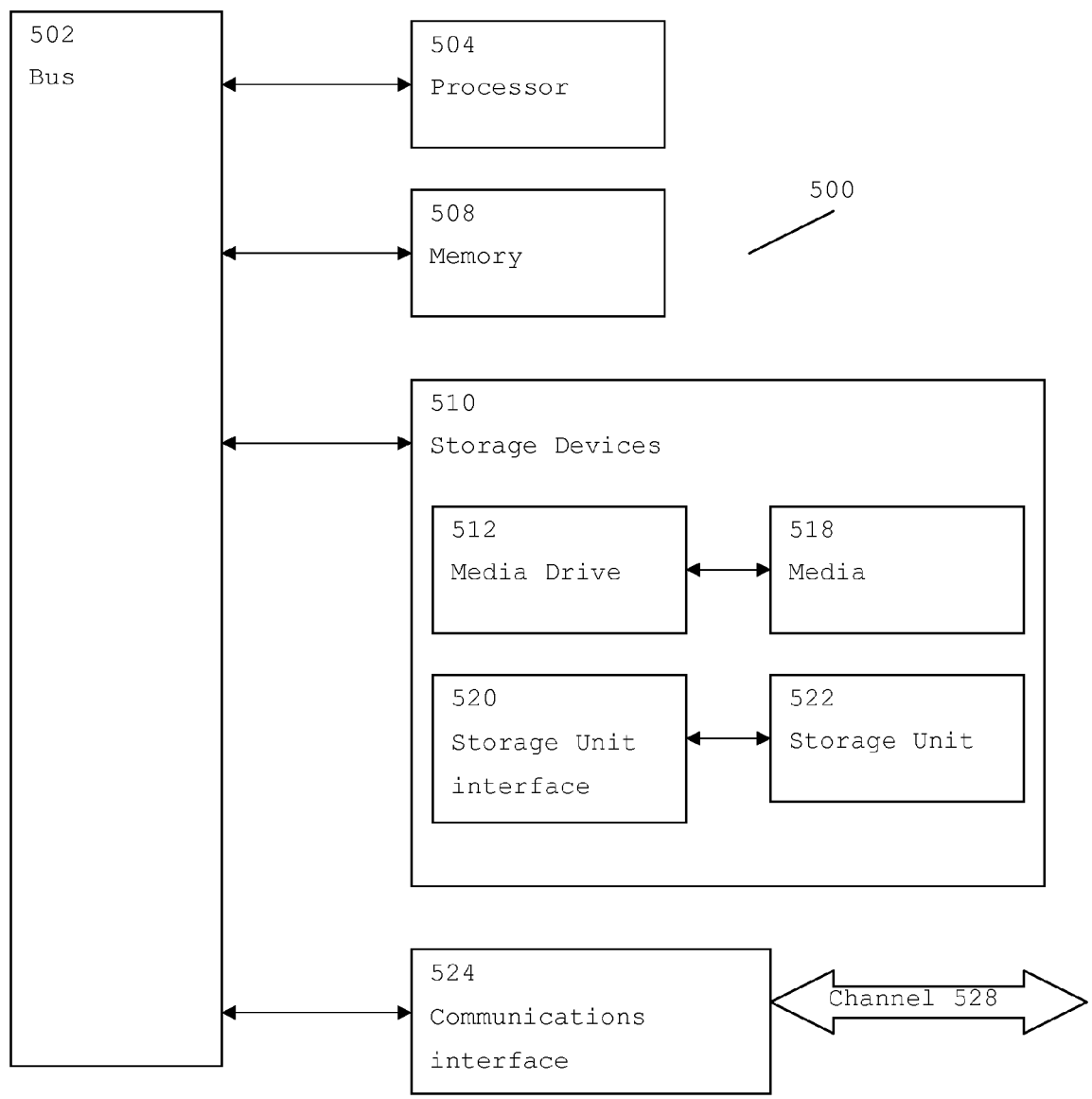

FIG. 5 illustrates a typical computing system that may be employed to implement processing functionality in embodiments of the invention.

DETAILED DESCRIPTION OF EMBODIMENTS OF THE INVENTION

Embodiments of the invention find particular applicability in a cellular communication system that supports a number of overlapping communication coverage areas, for example a communication system that comprises a combination of femto cells and macro cells. Embodiments of the invention may be used by any communication unit needing to frequency synchronise to another communication unit. For example, embodiments of the invention may be used by a UE comprising a wideband code division multiple access (WCDMA) receiver. Embodiments of the invention may be employed particularly by a femto cell receiver operating in a cellular communication system comprising both femto cell base-stations (termed APs hereafter) and macro-cell NodeBs. In particular, embodiments of the invention enable a femto cell downlink receiver to synchronise to and use a macro-cell NodeB's frequency and timing transmissions, and reject any femto cell AP frequency and timing transmissions. Such synchronisation is performed prior to decoding the respective transmitted channels.

Those skilled in the art, however, will recognize and appreciate that the specifics of this example are merely illustrative of some embodiments and that the teachings set forth herein are applicable in a variety of alternative settings. For example, since the teachings described hereafter do not depend on a particular cellular communication network conforming to any specific standard, it is envisaged that the teachings and inventive concept described herein can be applied to any type of cellular communication network, although a $3^{rd}$ generation partnership project (3GPP) network is shown in this embodiment. As such, other alternative implementations within cellular communication networks conforming to different standards are contemplated and are within the scope of the various teachings described.

Figure 1:
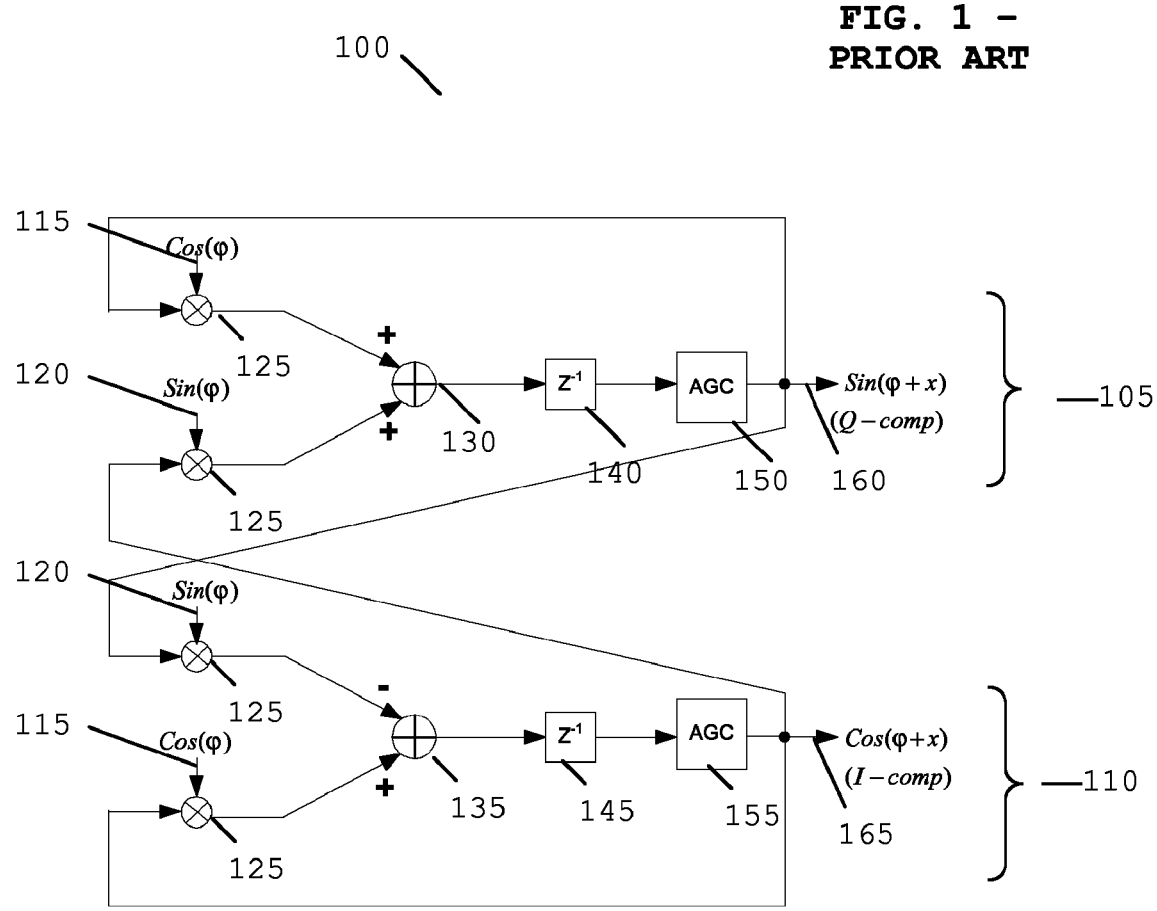
FIG. 1 illustrates a known quadrature coupled recursive software digital oscillator architecture.

The inventors have recognised that the software digital oscillator architecture proposed in FIG. 1 is not flexible enough to meet the instruction budget required to meet a high throughput, such as 15.36 MSPS (mega samples per second), for a WCDMA receiver. A primary reason for this has been identified as being due to the components in the software digital oscillator architecture proposed in FIG. 1 being sequentially arranged.

Referring now to the drawings, and in particular FIG. 2, an example of part of a 3GPP network, adapted in accordance with embodiments of the invention, is illustrated and indicated generally at 200. In FIG. 2, there is illustrated an example of a communication system combining macro cells 285 and femto cells 250 in accordance with one embodiment of the invention. In a femto cell network it is known that there may be a very large number of femto cells per macro cell. Thus, the coverage area of a single macro cell will inevitably encompass a coverage area of a large number of femto cells.

For the embodiment illustrated in FIG. 2, a radio network sub-system (RNS) comprises two distinct architectures to handle the respective macro cell and femto cell communications. In the macro cell scenario, the RNS comprises a radio network controller (RNC) 236 having, inter alia, processing logic 238 and being operably coupled to a network element 242, such as a serving general packet radio system (GPRS) support node (SGSN)/mobile switching centre (MSC), as known.

In a femto cell scenario, an RNS 210 comprises a network element in a form of an Access Point (AP) 230, and a controller in a form of an AP controller 240. As will be appreciated by a skilled artisan, an Access Point (AP) 230 is a communication element that facilitates access to a communication network via a communication cell, such as a femto-cell. One application that has resulted in the interest in femto cell technology is that an AP 230 may be purchased by a member of the public and installed in their home. The AP 230 may then be connected to an AP controller 240 over the owner's broadband internet connection 260.

Thus, an AP 230 is a scalable, multi-channel, two-way communication device that may be provided within, say, residential and commercial (e.g. office) locations, 'hotspots' etc, to extend or improve upon network coverage within those locations. Although there are no standard criteria for the functional components of an AP, an example of a typical AP for use within a 3GPP system may comprise some Node-B functionality and some aspects of radio network controller (RNC) 236 functionality. The AP communicates with UEs, such as UE 214, via a wireless interface (Uu).

The AP controller 240 may be coupled to a core network (CN) 242 via an Iu-PS interface as shown. In this manner, the AP 230 is able to provide voice and data services to a cellular handset, such as UE 214, in a femto cell in contrast to the macro cell, in the same way as a conventional Node-B, but with the deployment simplicity of, for example, a Wireless Local Area Network (WLAN) access point.

In accordance with embodiments of the invention, described in greater detail with respect to FIG. 3 and FIG. 4 below, a femto cell AP 230 is adapted to perform a software-based method to frequency synchronise to a macro cell NodeB, such as synchronising to transmissions 220 from NodeB 224, and reject AP timing transmissions 222, in its frequency synchronising operation.

In particular, the femto cell AP 230 comprises a downlink (DL) receiver circuit 235 that has been adapted to frequency synchronise to a number of (macro and femto) cells in software, decode the cells' transmissions, reject the frequency errors estimated from other femto cells, and select only frequency error estimations from macro cells. In particular, the downlink (DL) receiver circuit 235 distinguishes between femto cells and macro cells by decoding the broadcast channel transmitted by the Node-Bs and other femto cell APs. For example, in one embodiment of the invention, a Public Land Mobile Network (PLMN) identifier (ID) contained in the broadcast channel may be decoded to enable the Operator to associate it with macro cells from the Operator's current network plan configuration.

In accordance with embodiments of the invention, the femto cell AP is configured to then calculate a statistical aggregate (for example an average or median) frequency drift. The femto cell AP is then adapted to adjust (correct) the operating frequency of its hardware crystal to synchronise to only macro cell communications in its communication environment.

Referring now to FIG. 3, a block diagram of a communication unit 300, and particularly a receiver's frequency synchronisation sub-system therein, adapted in accordance with embodiments of the invention, is illustrated. In one embodiment of the invention, the communication unit may be the femto cell downlink receiver 235 of FIG. 2.

The WCDMA communication unit 300 comprises an antenna 302 for receiving transmissions from a macro cell NodeB and/or a femto cell AP. The antenna 302 is operably coupled to radio receiver block 304 comprising known Radio Frequency (RF) circuitry and (if appropriate in some embodiments) Intermediate Frequency (IF) circuits that are capable of receiving and down-converting the WCDMA downlink RF signals from the antenna 302, to, say, 5 MHz baseband IQ analogue signals 308.

A data converter 312, for example in a form of analogue-to-digital converter, converts the down-converted baseband analogue (IQ) signals 308 to baseband digital (IQ) data samples 314 at, say, an over-sampling rate of $F_s$ (for example, 15.36 MHz, as established earlier). The over-sampling rate ($F_s$) is derived from the VCTCXO crystal 336 based on a ratio (M/N) set by multiplier logic 338. The VCTCXO crystal 336 also provides the local oscillator (LO) frequency, $F_{LO}$, to radio receiver block 304, to ensure correct base-band frequency down-conversion.

However, in prior art arrangements, the baseband IQ digital samples 314 contain a frequency drift, which is dependent upon the frequency drift of the VCTCXO 336.

In embodiments of the invention, the frequency drift is compensated by frequency compensation logic 316, based on compensation I/Q signals generated by the software digital oscillator 330. Baseband frequency estimator logic 318 estimates a residual frequency error in the IQ data samples following the frequency compensation, and forwards 322 the residual frequency error estimation to control logic 326. Control logic 326 is arranged to process the residual frequency error estimation and inform 328, 334 the software digital oscillator 330 or the hardware VCTCXO 336 of the amount of frequency adjustment to effect using an appropriate synthesising algorithm, in order to correct the frequency drift.

The down-converted, frequency-compensated, baseband digital IQ samples are then input to a WCDMA rake receiver and decoder logic 320. In one embodiment of the invention, rake receiver and decoder logic 320 is arranged to decode a broadcast channel of the received signal, which contains the system information that informs 324 the control logic 326 whether the channel being received is from a femto cell or a macro cell. Control logic 326 is then able to decide whether to ignore the frequency estimations of the decoded channel, for example if it determines that they emanate from an AP of a femto cell, or use the frequency error in its aggregate frequency error estimation, for example if it determines that they emanate from a NodeB of a macro cell. Note that the aggregate is taken in order to filter out any frequency drifts in individual NodeB's crystal oscillator themselves (within +/−0.05 PPM as established earlier), and thus arrive at a better estimate.

In a 3GPP embodiment for a femto cell AP, the maximum and minimum frequency requirements on the software digital oscillator 330 are as follows:

(i) The maximum frequency that shall be generated by the software digital oscillator 330 shall be sufficient to compensate the worst-case frequency drift in typical crystals used in a femto cell UE.

(ii) The minimum frequency that shall be generated by the software digital oscillator 330 is at least sufficient to compensate a frequency error that is required for operation of the WCDMA rake receiver and decoder 320, without degradation in its performance.

Thus, in this manner, the software digital oscillator 330 is able to generate I (Cosine) and Q (Sine) waveforms up to a maximum of +/−21.70 KHz and a minimum of at least +/−210 Hz (as established earlier), to be able to de-rotate the input samples, and correct for a maximum of +/−10 ppm drift introduced by the VCTCXO crystal 336.

In accordance with embodiments of the invention, the digital software oscillator 330 in the baseband modem generates low-frequency, in-phase (cosine) and quadrature (sine) component waveforms in order to de-rotate the digitised data samples input to frequency compensation logic 316. In this manner, crystal induced frequency error, due to the VCTCXO 336 drift, resulting in frequency error relative to the macro cell NodeB transmitted frequency during the frequency down-conversion function, may be removed.

Advantageously, with the architecture described in FIG. 3, there is no need for the femto cell downlink receiver to repeatedly correct/tune the hardware VCTCXO crystal 336 to each and every base station (NodeB or AP) within its coverage area in order to synchronise to each cell.

In using a software digital oscillator 330, and control logic 326 configured to reject any frequency error estimation of a femto cell transmission, as described above, the femto cell downlink receiver's baseband modem 310 is able to synchronise in software to different macro cells and arrive at a mean frequency drift of the selected macro cells.

The femto cell downlink receiver's baseband modem 310 then physically tunes the hardware VCTCXO crystal 336, a single time, so that it is within the desired performance range for all receivable macro cell NodeB transmissions. Advantageously, physically tuning the hardware VCTCXO crystal 336 a single time remains accurate until the next network listen is initiated by the Operator, which would typically be in a couple of days or a week, depending upon the VCTCXO part's drift rate.

In a worst case scenario, following the known approach currently adopted, a femto cell downlink receiver may be configured by the Operator to scan the whole 3GPP DL frequency band (2.11 GHz to 2.17 GHz) for potential macro/femto cells. In which case, the hardware crystal oscillator is synchronised in turn to every detected cell. This is time consuming, since this process will have to accommodate for a finite settling time, after which the hardware crystal oscillator typically reflects the frequency change applied. Doing this operation for every frequency correction per cell, will also consume time.

In contrast, the software digital oscillator approach described with respect to FIG. 3 and FIG. 4 has no such associated settling time and the frequency correction applied is reflected instantaneously.

Referring now to FIG. 4, a software digital quadrature-coupled oscillator architecture 400, is illustrated, in accordance with embodiments of the invention. Notably, the software digital quadrature-coupled oscillator architecture 400 comprises parallel slow-AGC logic and non-AGC controlled oscillator stage/output and AGC controlled final oscillator stage/output. The software digital quadrature-coupled oscillator architecture 400, in one embodiment of the invention, may be the software digital oscillator 330 of FIG. 3.

In addition, the inventors have recognised a disadvantage with the prior art oscillator architecture proposed in FIG. 1, in that it is wholly sequential in nature, per LO quadrature generation path.

The principle of operation of the standard Quadrature Coupled Recursive Oscillator illustrated in FIG. 4 is based on the following two trigonometric formulas, which produce the oscillator I/Q outputs as a recursive relation—i.e., the next output is dependent upon the past outputs of itself and the other Q/I component output(s):

$$\mathrm{Cos}(\phi+Nx)=\mathrm{Cos}(\phi)\mathrm{Cos}(Nx)-\mathrm{Sin}(\phi)\mathrm{Sin}(Nx)$$

$$\mathrm{Sin}(\phi+Nx)=\mathrm{Sin}(\phi)\mathrm{Cos}(Nx)+\mathrm{Cos}(\phi)\mathrm{Sin}(Nx) \quad [1]$$

where:

N is equal to the number of stages. In FIG. 4, N=2; and

φ represents the phase angle change per I/Q sample and hence defines the frequency synthesized by the software digital oscillator, $F_R$, using the relation:

$$F_R = \varphi \frac{F_S}{2\pi} \quad [2]$$

where $F_s$ is 15.36 MHz—the 4 times over-sampled frequency.

The initialisation values, Sin(φ) and Cos(φ), for a new frequency generated is set as follows:

Sin(φ)≈φ

Cos(φ)≈1

Sin(x)=Sin(φ),Cos(x)=Cos(φ) [3]

for small values of φ radians.

The inventors have also identified that sequential AGC logic (150, 155 in FIG. 1) need not scale each oscillator output sample, if the architecture is modified according to the embodiment of FIG. 4. Instead, for example, slow AGC logic may be configured to scale the oscillator output intermittently, for example every other oscillator output sample, or in general, once every 'N' oscillator output samples, where N is decided based on the number of instructions available per oscillator output, to provide the necessary throughput from the oscillator.

Note that, the N-1 outputs in this case will be output without AGC control, but this has no significant effect on the oscillator output amplitudes. Thus, for the remainder of the description of embodiments, it is envisaged that 'intermittent' encompasses 'periodic' and indeed, for example, any other programmable interlude that falls outside every oscillator output sample.

It is envisaged that 'N' may be programmable and may be configured to be different values for different digital signal processors (DSPs) that a femto cell receiver modem may use, since the number of instructions per oscillator output and, hence, the oscillator throughput, is dependent upon the particular DSP processor clock speed and architecture used in the UE.

The inventors have further recognised that, by decoupling the sequential Automatic Gain Control (AGC) component of the known software digital oscillator arrangement of FIG. 1, computing the (slow) AGC values in a parallel arrangement, as shown, and applying the resulting gain intermittently, for example on every other I/Q sampled output (hereinafter referred to as a 'slow AGC' arrangement in summing logic 484, 486 of FIG. 4), the quality of the digital oscillator 'I' and 'Q' outputs are not compromised.

Notably, the aforementioned features provide an advantage that the gain computed by the AGC may be applied to every $N^{th}$ output I/Q sample, where N is programmable depending on the DSP MIPS (Millions of instructions per second) and architecture. The rest (N-1) I/Q sample outputs from the oscillator are output without AGC and overall the oscillator throughput is improved.

For instance, to clarify the above throughput advantage, let us consider a scenario where the chosen DSP architecture on which the communication unit receiver modem is implemented requires the software digital oscillator to have a throughput of 10 instructions per oscillator I/Q output. In order to synthesize an I/Q output waveform at 15.36 MSPS in a 3GPP communication unit (4 times over-sampling for Rake operation, as established earlier), the architecture of FIG. 1 requires 8 instructions and 10 instructions for the I/Q component generation (all blocks up to and including 140 and 145) and AGC functions (150 and 155) respectively. Notably, as the known architecture in FIG. 1 comprises a serial arrangement, then the throughput provided by the FIG. 1 architecture is limited to 18 instructions per oscillator output.

In contrast, by decomposing the architecture illustrated in FIG. 1 such that the AGC is operated in parallel (490 and 495 of FIG. 4) in a feed-forward AGC arrangement, and using a two-stage recursive digital oscillator (that is N=2) as per the proposed architecture of FIG. 4, the throughput may be improved to within the 10 instructions per I/Q oscillator output requirement. Likewise, it is envisaged that using another vendor's DSP architecture, the implementation may be decomposed in a similar manner with the number of stages (N) designed depending upon the instruction set of that particular DSP.

The software digital oscillator 400 design of FIG. 4 comprises both sequential and parallel arrangement of quadrature LO generation paths. The quadrature LO generation paths comprise a sinusoid LO generation path 405 and a cosinusoid LO generation path 410. The paths are symmetric in the upper/lower half of FIG. 4, for the IQ components respectively as shown. Both paths 405, 410 comprise quadrature (IQ) multiplication logic stages 425, which multiply a Sin(φ) 420 or Cos(φ) 415 component with a feedback component of Sin(φ+Nx) (Q-component) 487 or Cos(φ+Nx) (I-component) 488, as illustrated.

The quadrature multiplication logic stages 425 are respectively input to a summing stage 430, 435 and either summed (Q-component) or subtracted (I-component), before being input to respective delay logic elements 440, 445. The outputs 450, 455 from the respective delay logic elements 440, 445 are output as I/Q quadrature samples of the oscillator, Sin(φ+x) (Q-component)and Cos(φ+x) (I-component) respectively. In addition, they are input to a further quadrature coupled recursive software digital oscillator circuit. Thus, the outputs 450, 455 of the first stage of the quadrature coupled software digital oscillator are input to a second stage of the quadrature coupled software digital oscillator, which comprises quadrature multiplication logic stages 460, 465. The second stage quadrature multiplication logic stages 460, 465 again multiply a Sin (φ) or Cos (φ) component with the outputs 450, 455 of the first stage quadrature coupled software digital oscillator and produce respective inputs to a summing stage 470, 475, where they are either summed (Q-component) or subtracted (I-component). Thereafter, the outputs of the summing stages 470, 475 are input to respective delay logic elements 480, 482.

In accordance with one embodiment of the invention, the quadrature coupled recursive software digital oscillator of FIG. 1 has been significantly re-designed. For example, in FIG. 4, the known quadrature coupled recursive software digital oscillator has been modified and extended to comprise two stages, with a first stage non-recursive and a second stage recursive, and the software digital oscillator re-configured to be a feed-forward (rather than feedback) AGC circuit. In this manner, the quadrature coupled recursive software digital oscillator is now able to address the previous practical limitation of being able to process a sufficient number of instructions per oscillator output, in order to meet a required throughput of 15.36 mega I,Q samples/second in a WCDMA implementation. Increasing a number of stages advantageously increases the throughput, since there is more time to perform slow AGC logic updates, as established earlier. Here, the intermediate stages are 'AGC-less' and, hence, require less instructions to complete. Note, only in the last stage is AGC applied.

Thus, in accordance with one embodiment of the invention, two stages are implemented, with a first stage being configured without any AGC function, and a second recursive stage located in series with the first non-recursive stage and implemented with an AGC function, as shown. With this configuration, and notably employing feedforward AGC logic, the MIPS budget may be achieved.

Notably, in accordance with one embodiment of the invention, the outputs from the respective delay logic elements 480, 482 are input to final summing logic elements 484, 486, where they are combined with signals output from slow AGC logic elements 490, 495. The slow AGC logic elements 490, 495, in FIG. 4, control the output amplitude of each of the respective oscillator paths by keeping the gain close to unity, which ensures sustained oscillator output. Thus, the quadrature oscillator outputs AGC controlled I/Q sample outputs 487, 488 denoted as $\sin(\phi+Nx)$ (Q-component) and $\cos(\phi+Nx)$ (I-component) respectively in FIG. 4. In one embodiment of the invention, the software digital oscillator 400 is controlled by the control logic 326 of FIG. 3 wherein, the control logic 326 signals the oscillator to generate a new frequency and, in response, the software oscillator resets the AGC logic elements 490, 495 of FIG. 3 in addition to re-initialising itself based on the new frequency to be generated, as established earlier.

In accordance with one embodiment of the invention, the slow AGC logic elements 490, 495 measure a signal power at the input of the oscillator, which is the fed back signal power of the quadrature coupled recursive software digital oscillator (330 in FIG. 3) outputs 487 and 488, and scale the respective oscillator outputs to a constant reference power periodically. For example, the periodic scaling may be performed once every two oscillator output samples (i.e., 'N=2'). This allows the AGC calculations to be processed in parallel with the 'I-Q' processing paths 405, 410.

In one embodiment of the invention, the quadrature coupled recursive software digital oscillator may be implemented on a core of parallel DSPs, termed Array Elements (AE) interconnected into an array over a time division multiplexed bus. In this embodiment, the oscillator implementation may be achieved on one or more of the following AEs:
  (i) An AE for computing the Cosine (I) component
  (ii) An AE for computing the Sine (Q) component
  (iii) An AE for computing AGC and scaling the 'I' & 'Q' components by the resulting gain with respect to a constant reference power, but, for example, every other I/Q output (if N=2).

One advantage of implementing such slow AGC logic in each path is that it allows the AGC to be computed in parallel with the 'I-Q' outputs as shown in FIG. 4, while the oscillator outputs non-AGC controlled outputs until an AGC value is available. In this manner, the slow AGC logic elements 490, 495 enable the software digital oscillator to be practically realised, even at high throughputs, as established earlier.

The slow AGC logic elements 490, 495 ensure that errors due to finite word-length, because of the recursive nature of the software digital oscillator architecture and non controlled AGC I/Q ouputs whose gain will be slightly greater/lesser than unity, will not accumulate. Otherwise, such accumulated errors would eventually lead to an unstable output (thereby producing increasing or decaying output if the gain is greater than '1' or less than '1' respectively).

The outputs from each of the N-1 non-AGC controlled stages $\sin(\phi+x)$ (Q-component) 450 and $\cos(\phi+x)$ (I-component) 455 along with the outputs from the respective final summing logic elements 484, 486 namely $\sin(\phi+Nx)$ (Q-component) 487 and $\cos(\phi+Nx)$ (I-component) 488 form the outputs from the software digital oscillator 400.

It is envisaged that the aforementioned embodiments aim to provide one or more of the following advantages:
  (i) An ability to provide a Quadrature Coupled Recursive software digital oscillator using a new parallel-configured, slow-AGC circuit.
  (ii) Enable a femto cell downlink receiver to tune to multiple reference signals and select suitable timing signals to tune to. For example, when a femto cell is operating in a combined macro cell/femto cell environment, the femto cell is able to distinguish between macro-cell and femto cell frequency transmissions, discard any other received femto cell frequency signals, and utilise an average frequency signal from the selected macro cells to synchronise its internal signals to.
  (iii) The software digital oscillator may be adapted to be implemented on any DSP architecture by changing the value 'N' to slow down the AGC. Thus, in this manner, an increase in the throughput may be achieved by outputting from 'N-1' non-AGC controlled stages, depending on the clock speed of the particular DSP.
  (iv) A Rake receiver and decoder logic (320) may be combined together to perform channel decoding and identify a transmitter of system information, in order for selected transmitters to be selected for synchronisation purposes or rejected.
  (v) The inventive concept only requires supporting functionality to be provided within a femto cell, and thus does not require supporting functionality to be provided within the core network.
  (vi) Embodiments of the invention propose a software de-rotation of processed frequency signals, which compensates an operating frequency of a crystal to correct residual frequency errors, such that there is no settling time wait and the frequency change is reflected instantaneously.

FIG. 5 illustrates a typical computing system 500 that may be employed to implement processing functionality in embodiments of the invention. Computing systems of this type may be used in UEs or femtocell downlink receiver (in particular, processing logic in UE or a femto cell modem that handles frequency synchronisation). Those skilled in the relevant art will also recognize how to implement the invention using other computer systems or architectures. Computing system 500 may represent, for example, a desktop, laptop or notebook computer, hand-held computing device (PDA, cell phone, palmtop, etc.), mainframe, server, client, or any other type of special or general purpose computing device as may be desirable or appropriate for a given application or environment. Computing system 500 can include one or more processors, such as a processor 504. Processor 504 can be implemented using a general or special-purpose processing engine such as, for example, a microprocessor, microcontroller or other control logic. In this example, processor 504 is connected to a bus 502 or other communications medium.

Computing system 500 can also include a main memory 508, such as random access memory (RAM) or other dynamic memory, for storing information and instructions to be executed by processor 504. Main memory 508 also may be used for storing temporary variables or other intermediate information during execution of instructions to be executed by processor 504. Computing system 500 may likewise include a read only memory (ROM) or other static storage device coupled to bus 502 for storing static information and instructions for processor 504.

The computing system 500 may also include information storage system 510, which may include, for example, a media drive 512 and a removable storage interface 520. The media drive 512 may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media 518 may include, for example, a hard disk, floppy disk, magnetic tape, optical disk, CD or DVD, or other fixed or removable medium that is read by and written to by media drive 54. As these examples illustrate, the storage media 518 may include a computer-readable storage medium having particular computer software or data stored therein.

In alternative embodiments, information storage system 510 may include other similar components for allowing computer programs or other instructions or data to be loaded into computing system 500. Such components may include, for example, a removable storage unit 522 and an interface 520, such as a program cartridge and cartridge interface, a removable memory (for example, a flash memory or other removable memory module) and memory slot, and other removable storage units 522 and interfaces 520 that allow software and data to be transferred from the removable storage unit 518 to computing system 500.

Computing system 500 can also include a communications interface 524. Communications interface 524 can be used to allow software and data to be transferred between computing system 500 and external devices. Examples of communications interface 524 can include a modem, a network interface (such as an Ethernet or other NIC card), a communications port (such as for example, a universal serial bus (USB) port), a PCMCIA slot and card, etc. Software and data transferred via communications interface 524 are in the form of signals which can be electronic, electromagnetic, and optical or other signals capable of being received by communications interface 524. These signals are provided to communications interface 524 via a channel 528. This channel 528 may carry signals and may be implemented using a wireless medium, wire or cable, fiber optics, or other communications medium. Some examples of a channel include a phone line, a cellular phone link, an RF link, a network interface, a local or wide area network, and other communications channels.

In this document, the terms 'computer program product' 'computer-readable medium' and the like may be used generally to refer to media such as, for example, memory 508, storage device 518, or storage unit 522. These and other forms of computer-readable media may store one or more instructions for use by processor 504, to cause the processor to perform specified operations. Such instructions, generally referred to as 'computer program code' (which may be grouped in the form of computer programs or other groupings), when executed, enable the computing system 500 to perform functions of embodiments of the present invention. Note that the code may directly cause the processor to perform specified operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 500 using, for example, removable storage drive 54, drive 512 or communications interface 524. The control logic (in this example, software instructions or computer program code), when executed by the processor 504, causes the processor 504 to perform the functions of the invention as described herein.

It will be appreciated that, for clarity purposes, the above description has described embodiments of the invention with reference to different functional units or logic elements or signal processors. However, it will be apparent that any suitable distribution of functionality between different functional units or logic elements or signal processors, for example with respect to the UE, may be used without detracting from the invention. For example, it is envisaged that functionality illustrated to be performed by separate processors or controllers or logic elements may be performed by the same processor or controller or logic element. Hence, references to specific functional or logical units are only to be seen as references to suitable means for providing the described functionality, rather than indicative of a strict logical or physical structure or organization.

Some aspects of the invention may be implemented in any suitable form including hardware, software, firmware or any combination of these. The invention may optionally be implemented, at least partly, as computer software running on one or more data processors and/or digital signal processors. Thus, the elements and components of an embodiment of the invention may be physically, functionally and logically implemented in any suitable way. Indeed, the functionality may be implemented in a single unit, in a plurality of units or as part of other functional units.

Although the invention has been described in connection with some embodiments, it is not intended to be limited to the specific form set forth herein. Rather, the scope of the present invention is limited only by the claims. Additionally, although a feature may appear to be described in connection with particular embodiments, one skilled in the art would recognize that various features of the described embodiments may be combined in accordance with the invention.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather the feature may be equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, a method and apparatus for performing frequency synchronisation, for example by a femtocell downlink receiver in a cellular communication system that combines macro-cell and femto-cells, has been described that may alleviate at least some of the shortcomings of past and present techniques and/or mechanisms.

The invention claimed is:

1. A communication unit capable of communicating in a cellular communication network, wherein the communication unit comprises:
   a receiver for receiving downlink timing signals from a plurality of serving wireless communication units;

a frequency synchronizing circuit operably coupled to the receiver for synchronizing an operating frequency of the communication unit to a serving wireless communication unit; and control logic capable of controlling the frequency synchronizing circuit to adjust the operating frequency;

wherein the control logic is arranged to distinguish between macro cell transmissions and femto cell transmissions and in response thereto selectively use or reject timing signals from the plurality of serving wireless communication units in adjusting the operating frequency of the wireless communication unit.

2. The communication unit of claim 1, wherein the control logic is arranged to decode system information messages of the plurality of serving wireless communication units to identify respective types of serving wireless communication units.

3. The communication unit of claim 1, wherein the control logic is arranged to selectively use macro cell timing signal transmissions and reject timing signal transmissions from femto cells.

4. The communication unit of claim 3, wherein the control logic is further arranged to calculate a statistical aggregate of macro cell transmissions.

5. The communication unit of claim 1, wherein the wireless communication unit comprises rake receiver and decoding logic that in combination perform broadcast channel decoding of received signals to determine from the system information contained therein the decoded broadcast channel whether the received signal is from a femto cell or a macro cell and based thereon to selectively use or reject timing signals from the plurality of serving wireless communication units.

6. The communication unit of claim 1, wherein the wireless communication unit is capable of frequency synchronizing to wideband code division multiple access (WCDMA) downlink transmissions.

7. The communication unit of claim 1, wherein the wireless communication unit further comprises frequency estimator logic arranged to estimate a residual frequency error in baseband quadrature data samples.

8. The communication unit of claim 7, wherein the frequency estimator logic is arranged to forward the estimated residual frequency error estimation to control logic.

9. The communication unit of claim 8, wherein the control logic is arranged to process the residual frequency error estimation and inform the frequency synchronizing circuit of an amount to correct a frequency drift.

10. The communication unit of claim 9, wherein the control logic is arranged to perform final synchronization of the communication unit's operating frequency to a selected macro cell timing signal after decoding signals received from the plurality of serving wireless communication units.

11. A radio network sub-system comprising a communication unit of claim 1.

12. A wireless communication system adapted to support the communication unit of claim 1.

13. A semiconductor device for a communication unit capable of communicating in a cellular communication network, the semiconductor device comprising:

a receiver for receiving downlink timing signals from a plurality of serving wireless communication units;

a frequency synchronizing circuit operably coupled to the receiver for synchronizing an operating frequency of the communication unit to the serving wireless communication unit; and control logic capable of controlling the frequency synchronizing circuit to adjust the operating frequency;

wherein the control logic is arranged to distinguish between macro cell transmissions and femto cell transmissions and in response thereto selectively use or reject timing signals from the plurality of serving wireless communication units in adjusting the operating frequency of the wireless communication unit.

14. A method for frequency synchronizing a communication unit capable of communicating in a cellular communication network, the method comprising:

receiving downlink timing signals from a plurality of serving wireless communication units;

synchronizing an operating frequency of the communication unit to a serving wireless communication unit of the plurality of serving wireless communication units; and distinguishing between macro cell transmissions and femto cell transmissions; and in response thereto selectively using or rejecting timing signals from the plurality of serving wireless communication units in adjusting an operating frequency of the wireless communication unit.

15. A tangible non-transistory computer program product having executable program code stored therein for programming signal processing logic to perform a method for frequency synchronizing a communication unit to a serving wireless communication unit of a cellular communication network, the code operable for, when executed at a communication unit:

receiving downlink timing signals from a plurality of serving wireless communication units; and synchronizing an operating frequency of the communication unit to a serving wireless communication unit of the plurality of serving wireless communication units;

distinguishing between macro cell transmissions and femto cell transmissions; and in response thereto selectively using or rejecting timing signals from the plurality of serving wireless communication units in adjusting an operating frequency of the wireless communication unit.

* * * * *

UNITED STATES PATENT AND TRADEMARK OFFICE
CERTIFICATE OF CORRECTION

PATENT NO. : 8,219,103 B2  
APPLICATION NO. : 12/863846  
DATED : July 10, 2012  
INVENTOR(S) : Gopikrishna Charipadi and James Edward Brereton Harrow Page 1 of 1

It is certified that error appears in the above-identified patent and that said Letters Patent is hereby corrected as shown below:

ON TITLE PAGE:

Section (57) Abstract: Line 8, After "units" insert a -- . --; and

IN THE CLAIMS:

Column 16, Claim 15, Line 36: Change "non-transistory" to -- non-transitory --.

Signed and Sealed this
Ninth Day of October, 2012

David J. Kappos
*Director of the United States Patent and Trademark Office*